United States Patent

Worfolk et al.

(10) Patent No.: US 10,099,963 B2
(45) Date of Patent: Oct. 16, 2018

(54) FORMATION OF FILMS FOR ORGANIC PHOTOVOLTAICS

(71) Applicant: PHILLIPS 66 COMPANY, Houston, TX (US)

(72) Inventors: Brian Worfolk, Bartlesville, OK (US); Nneka Uguru Eboagwu, Owings Mills, MD (US)

(73) Assignee: Phillips 66 Company, Houston, TX (US)

(*) Notice: Subject to any disclaimer, the term of this patent is extended or adjusted under 35 U.S.C. 154(b) by 0 days.

(21) Appl. No.: 15/245,676

(22) Filed: Aug. 24, 2016

(65) Prior Publication Data

US 2017/0096374 A1 Apr. 6, 2017

Related U.S. Application Data

(60) Provisional application No. 62/235,855, filed on Oct. 1, 2015.

(51) Int. Cl.
| | | |
|---|---|---|
| *H01B 1/08* | (2006.01) | |
| *C04B 35/00* | (2006.01) | |
| *C04B 35/457* | (2006.01) | |
| *C04B 35/453* | (2006.01) | |
| *H01L 51/00* | (2006.01) | |
| *H01L 51/42* | (2006.01) | |

(52) U.S. Cl.
CPC .......... *C04B 35/457* (2013.01); *C04B 35/453* (2013.01); *H01B 1/08* (2013.01); *H01L 51/00* (2013.01); *C04B 2235/3284* (2013.01); *C04B 2235/3293* (2013.01); *H01L 51/0036* (2013.01); *H01L 51/0047* (2013.01); *H01L 51/4233* (2013.01)

(58) Field of Classification Search
CPC .. H01B 1/00; H01B 1/08; C23C 18/00; C23C 18/08; C23C 18/12; C23C 30/00; B05D 5/12
See application file for complete search history.

(56) References Cited

U.S. PATENT DOCUMENTS

| | | | |
|---|---|---|---|
| 6,368,732 | B1 | 4/2002 | Jin et al. |
| 6,812,399 | B2 | 11/2004 | Shaheen et al. |
| 6,858,161 | B2 | 2/2005 | Abe et al. |
| 7,183,418 | B2 | 2/2007 | Heeney et al. |
| 7,332,223 | B2 | 2/2008 | Sotzing et al. |
| 7,507,351 | B2 | 3/2009 | Tsuda et al. |
| 7,524,922 | B2 | 4/2009 | Heeney et al. |
| 7,928,237 | B2 | 4/2011 | Clark et al. |
| 8,242,235 | B2 | 8/2012 | Tsuda et al. |
| 8,247,803 | B2 | 8/2012 | Choi et al. |

(Continued)

OTHER PUBLICATIONS

Jeong et al "Solution-processed zinc tin oxide semiconductor for thin-film transistors", Journal of Physical Chemistry C, 2008, 112, 11082-085. (Year: 2008).*

(Continued)

*Primary Examiner* — Mark Kopec
(74) *Attorney, Agent, or Firm* — Phillips 66 Company

(57) ABSTRACT

A reaction comprising an organic Zn precursor in the amounts of (1−y), an organic Sn precursor in the amounts of y and a base in the amount of (1−y). The product produced from the reaction is $(SnO_x)_y ZnO_{(1-y)}$.

13 Claims, 6 Drawing Sheets

(56) References Cited

U.S. PATENT DOCUMENTS

| | | | |
|---|---|---|---|
| 8,367,798 B2 | 2/2013 | Yang et al. | |
| 8,372,945 B2 | 2/2013 | Hou et al. | |
| 8,436,134 B2 | 5/2013 | Yu et al. | |
| 8,653,228 B2 | 2/2014 | Yu et al. | |
| 8,703,960 B2 | 4/2014 | Huang | |
| 8,895,751 B2 | 11/2014 | Huang | |
| 8,968,885 B2 | 3/2015 | Brown et al. | |
| 2003/0194630 A1 | 10/2003 | Beck et al. | |
| 2005/0082525 A1 | 4/2005 | Heeney et al. | |
| 2005/0176684 A1 | 8/2005 | Bookser et al. | |
| 2005/0209419 A1 | 9/2005 | Zahn et al. | |
| 2006/0071200 A1 | 4/2006 | Nordquist et al. | |
| 2006/0223977 A1 | 10/2006 | Zahn et al. | |
| 2008/0103286 A1 | 5/2008 | Ong et al. | |
| 2009/0159120 A1 | 6/2009 | Wang et al. | |
| 2009/0159131 A1 | 6/2009 | Zheng et al. | |
| 2009/0159999 A1 | 6/2009 | Zheng et al. | |
| 2010/0006148 A1 | 1/2010 | Zheng et al. | |
| 2010/0018581 A1 | 1/2010 | Shrotriya et al. | |
| 2010/0078074 A1 | 4/2010 | Yang et al. | |
| 2010/0101636 A1 | 4/2010 | Zheng et al. | |
| 2010/0137518 A1 | 6/2010 | Yang et al. | |
| 2010/0224832 A1 | 9/2010 | Jou et al. | |
| 2010/0251936 A1* | 10/2010 | Kim | C23C 18/1216 106/286.6 |
| 2010/0276071 A1 | 11/2010 | Shrotriya et al. | |
| 2010/0300520 A1 | 12/2010 | Su et al. | |
| 2010/0326497 A1 | 12/2010 | Yang et al. | |
| 2011/0008926 A1 | 1/2011 | Irvin et al. | |
| 2011/0031875 A1 | 2/2011 | Jou et al. | |
| 2011/0086994 A1 | 4/2011 | Wigglesworth et al. | |
| 2011/0124822 A1 | 5/2011 | Yu et al. | |
| 2011/0147725 A1 | 6/2011 | Seshadri | |
| 2011/0204341 A1 | 8/2011 | Brown et al. | |
| 2012/0052435 A1* | 3/2012 | Anazawa | B82Y 30/00 430/111.35 |
| 2012/0071617 A1 | 3/2012 | Dueggeli et al. | |
| 2012/0085992 A1 | 4/2012 | Beujuge et al. | |
| 2012/0118368 A1 | 5/2012 | Huang et al. | |
| 2012/0123058 A1 | 5/2012 | Ohno et al. | |
| 2012/0232237 A1 | 9/2012 | Li et al. | |
| 2012/0264906 A1 | 10/2012 | Marks et al. | |
| 2013/0056071 A1 | 3/2013 | Palkar et al. | |
| 2013/0214213 A1 | 8/2013 | Wang et al. | |
| 2014/0151657 A1 | 6/2014 | Wang et al. | |
| 2014/0221590 A1 | 8/2014 | Woody et al. | |
| 2015/0136224 A1 | 5/2015 | Shi et al. | |
| 2015/0210800 A1 | 7/2015 | Wang et al. | |

OTHER PUBLICATIONS

Song et al "Solution processed invisible all-oxide thin film transistors", J. Mater. Chem., 2009, 19, 8881-86. (Year: 2009).*

* cited by examiner

FORMATION OF FILMS FOR ORGANIC PHOTOVOLTAICS

CROSS-REFERENCE TO RELATED APPLICATIONS

This application is a Non-Provisional application which claims the benefit of and priority to U.S. Provisional Application Ser. No. 62/235,855 filed Oct. 1, 2015, entitled "Formation of Films for Organic Photovoltaics," which is hereby incorporated by reference.

STATEMENT REGARDING FEDERALLY SPONSORED RESEARCH OR DEVELOPMENT

None.

FIELD OF THE INVENTION

This invention relates to the formation of films for organic photovoltaics.

BACKGROUND OF THE INVENTION

The present disclosure generally relates to organic solar cells and similar electronic devices. Today's increasing demand for renewable energy resources, especially solar power, is driving researchers to develop low cost, efficient photovoltaic devices. Organic photovoltaics (OPVs) are an attractive route toward solving the terawatt energy problem.

Solution processed organic photovoltaics have the potential to become a low-cost photovoltaic technology. OPVs can be fabricated on flexible substrates in a roll-to-roll process, which may enable photovoltaics to enter entirely new markets. One of the milestones for commercialization of OPVs is improving device efficiencies, which reduces overall cost. One way of improving device efficiency is through utilizing interfacial charge transport layers.

Interfacial charge transport layers sandwich the photoactive layer and determine the device polarity, help to collect charges, and transport the charges to the electrodes. Materials for these charge transport layers can be transparent, have low resistance and be chemically stable. The electron transport layer collects and transports electrons mainly generated from the acceptor to the cathode. A low work function interface is required to make Ohmic contact with the organic photoactive layer. ZnO is a common n-type semiconductor used as an electron transport layer in OPVs. ZnO can be processed from a sol-gel solution, and when combined with post-annealing, produces crystalline thin films at low temperatures (150-200° C.). Tin oxide ($SnO_x$) is known to be highly transparent and conductive but higher post-annealing at 350-500° C. is often required. In addition, $SnO_x$ has one of the lowest oxygen and water vapor transmission rates for metal oxides, which may aid in organic electronic device stability.

The low work function of ZnO and high conductivity of $SnO_x$ have been previously combined to form mixed metal oxides whereby the ratio of Zn:Sn affects the electronic and physical properties of composites. These zinc tin oxides have application in a number of areas including transistors, sensors, transparent conductors and organic photovoltaics.

There exists a need for a new low temperature sol-gel solution processing technique for preparing zinc tin oxides with tunable composition.

BRIEF SUMMARY OF THE DISCLOSURE

A reaction comprising an organic Zn precursor in the amounts of (1−y), an organic Sn precursor in the amounts of y and a base in the amount of (1−y) to 1. The product produced from the reaction is $(SnO_x)_y ZnO_{(1-y)}$.

A reaction comprising an organic Zn precursor comprising $Zn(CH_3CO_2)_2$ in the amounts of (1−y), an organic Sn precursor comprising $Sn(CH_3CO_2)_2$ in the amounts of y, and a base comprising alkanolamine in the amount of (1−y) to 1. The reaction occurs at a temperature less than 225° C. to produce $(SnO_x)_y ZnO_{(1-y)}$.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

The present embodiment discloses a reaction of an organic Zn precursor in the amounts of (1−y), an organic Sn precursor in the amounts of y; and a base in the amount of (1−y) to 1. The resultant product is $(SnO_x)_y ZnO_{(1-y)}$.

In one embodiment the organic zinc precursor comprises $Zn(CH_3CO_2)_2$ or $Zn(CH_3CO_2)_2 \cdot 2H_2O$.

In one embodiment the organic tin precursor comprises $Sn(CH_3CO_2)_2$.

In another embodiment the base is an alcohol. Examples of bases that can be used including amines or alkanolamines.

In yet another embodiment, the reaction also comprises a solvent. The solvent can be used to dissolve either the zinc precursor or the tin precursor. One example of a solvent that can be used is water, alcohol, aminoalcohol, carboxylic acid, glycol, hydroxyester, aminoester or a mixture. Some examples include: 2-methoxyethanol, methanol, ethanol, propanol, butanol, pentanol, hexanol, ethyleneglycol, ethoxyethanol, methoxyethanol, ethoxypropanol, ethoxyethanol, dimethyloxyglycol, N,N-dimethylformamide.

Figure 1:
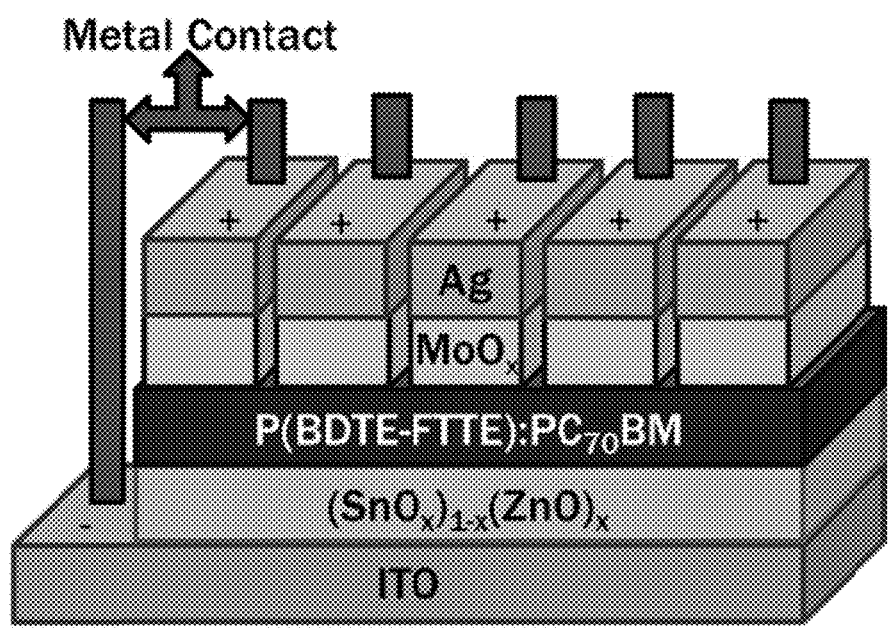
FIG. 1 depicts an inverted device architecture.

In one embodiment, $(SnO_x)_y ZnO_{(1-y)}$ is used as an electron transport layer for an organic photovoltaic device. In another embodiment the organic photovoltaic devices has an inverted device architecture. An inverted device architecture has the positive and negative electrodes reversed. FIG. 1 depicts an inverted device architecture which employs indium tin oxide as the cathode and silver as the anode. In this type of device, it is theorized that electrons need to move from the polymer:fullerene active layer to the cathode. Electrons are transported from the photoactive layer by the electron transport layer, and extracted to the transparent cathode.

In one embodiment, $(SnO_x)_y ZnO_{(1-y)}$ is a sol-gel solution.

In another embodiment, $(SnO_x)_y ZnO_{(1-y)}$ was prepared by dissolving zinc acetate dihydrate or tin(II) acetate in 2-methoxyethanol and ethanolamine. One example of the reaction is shown below:

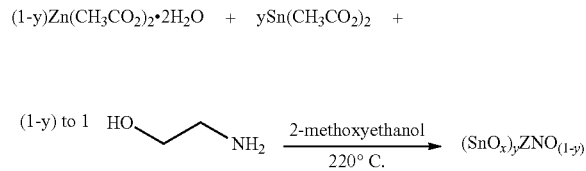

EXAMPLES

Solution Formation

A ZnO sol-gel solution was prepared by mixing 0.33 g $Zn(CH_3CO_2)_2$ in 3 mL of 2-methoxyethanol with 92 µL of ethanolamine. Similarly SnOx sol-gel solutions were prepared by dissolving 0.36 g of $Sn(CH_3CO_2)_2$ in 3.5 mL of 2-methoxyethanol, and 99 µL of ethanolamine. ZnO & SnOx were studied independently and as a mixed metal oxide system. Mixed sol-gel solutions were prepared from stock zinc and tin solutions. The amount of Sn in the mixed solution could be (5, 10, 15, 70, 95) vol %. In this embodiment the solutions were stirred for at least an hour before spin casting on indium tin oxide.

Device Fabrication

The photoactive layer consisted of the donor polymer poly(4,8-bis(5-2-ethylhexyl)thiophene-2-yl)benzo[1,2-b:4,5-b']dithiophene-2-ethylhexyl-4,6-dibromo-3-fluorothieno[3,4-b]thiophene-2-carboxylate (P(BDTE-FTTE)) and acceptor [6,6]-phenyl-C70-butyric acid methyl ester (PCBM) at a ratio of 1:1.6, respectively. The total solution concentration was 26 mg/mL in o-xylene. The photoactive layer solution was stirred and heated at 80° C. overnight in a nitrogen filled glove box. The next day 2.5 vol % of 1,8-diiodooctane was added and the solution was heated on the hot plate at 80° C. for an hour. The solution was then filtered with a 2.7 µm glass fiber syringe filter.

Indium tin oxide patterned glass substrates were cleaned by successive ultra-sonications in detergent, deionized water, acetone, and isopropanol. Each 15 min step was repeated twice and the freshly cleaned substrates were left to dry overnight at 80° C. Preceding fabrication, the substrates were further cleaned for 30 min in a UV-ozone chamber and the electron transport layer was immediately spin coated on top.

Single component or mixed metal oxide solutions were filtered directly onto indium tin oxide with a 0.25 µm poly(tetrafluoroethylene) filter and spin cast at 5000 rpm for 40 s. Film were then annealed at 220° C. for 15 min, and directly transferred into a nitrogen filled glove box. ZnO films were annealed at 170° C.

The photoactive layer was deposited on the electron transport layer via spin coating at 1200 rpm for 40 s and directly transferred into a glass petri dish to solvent anneal for 1 h. After solvent annealing, the substrates were loaded into the vacuum evaporator where MoOx (hole transport layer) and Ag (anode) were sequentially deposited by thermal evaporation. Deposition occurred at a pressure of 1×10-6 torr. MoOx and Ag had a thickness between 10 nm and 200 nm, respectively. Samples were then were then encapsulated with glass using an epoxy binder and treated with UV light for 3 min.

Table 1 depicts the photovoltaic parameters of ZnO and SnOx electron transport layer with the following device architecture: ITO/ETL/P(BDTE-FTTE):PCBM/MoOx/Ag.

TABLE 1

| ETL | Jsc (mA/cm²) | Voc (V) | FF (%) | PCE (%) | Rs (Ω cm²) | Rsh (Ω cm²) | Work Function (eV) |
|---|---|---|---|---|---|---|---|
| ZnO | 15.1 | 0.774 | 61.6 | 7.21 | 9.88 | 816 | 3.75 |
| $(SnO_x)_{0.05}(ZnO)_{0.95}$ | 14.8 | 0.760 | 55.2 | 6.67 | 5.06 | 288 | 3.68 |
| $(SnO_x)_{0.15}(ZnO)_{0.85}$ | 16.0 | 0.779 | 66.9 | 8.28 | 5.64 | 832 | 3.74 |
| $(SnO_x)_{0.75}(ZnO)_{0.25}$ | 15.6 | 0.713 | 55.8 | 6.17 | 12.4 | 623 | 3.93 |
| $(SnO_x)_{0.95}(ZnO)_{0.05}$ | 15.8 | 0.737 | 61.3 | 7.08 | 15.4 | 476 | 4.13 |
| $SnO_x$ | 15.7 | 0.757 | 62.3 | 7.41 | 6.87 | 769 | 4.15 |

Using ZnO as the electron transport layer resulted in an average power conversion efficiency (PCE) of 7.21%, compared to the average power conversion efficiency of SnOx of 7.41%. The tin oxide ETLs had higher short-circuit current density (Jsc) and lower series resistance (Rs) which can be attributed to its superior transparency and conductivity properties, respectively. ZnO devices had higher open-circuit voltages (Voc) presumably due to better interfacial energy alignment with the photoactive layer as a result of its lower bulk work function.

Mixed Metal Oxide Electron Transport Layers

Figure 2:
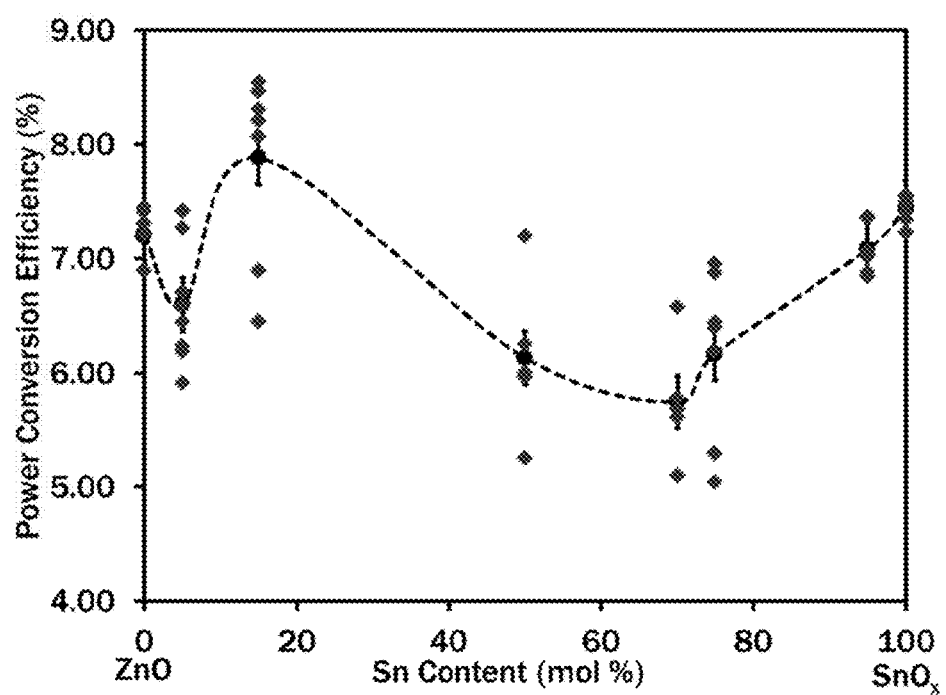
FIG. 2 depicts the effect of SnOx content in SnOx:ZnO mixed metal oxide electron transport layers.

In order to determine whether there is any effect of combining low work function ZnO with conductive SnOx, a range of mixed metal oxide compositions were prepared, where the SnOx component ranged from 5% to 95% (by volume). As the SnOx content increased, there is a peak in photovoltaic performance at 15% SnOx. On either side of 15% SnOx the performance drops significantly as seen in FIG. 2.

The high conductivity of tin oxide and the high transparency of ZnO have been combined at an optimal ratio of (SnOx)0.15(ZnO)0.85, which resulted in an average PCE of 8.28%. This is significantly higher than the photovoltaic performance of the pure ZnO or SnOx thin films. This composition had the best performance in all photovoltaic parameters except for the Rs. In general, ZTOs with a higher SnOx content had a superior Jsc, likely the result of higher transparency, but had a lower Voc due to the higher work functions of SnOx rich composites, as reported in the literature.

To further optimize the processing conditions for 15% SnOx, the films were annealed at 170, 200 and 220° C. to elucidate the effect on the photovoltaic performance. Table II depicts photovoltaic parameters of different annealing temperatures on $(SnOx)_{0.15}:(ZnO)_{0.85}$ electron transport layer organic photovoltaic devices.

TABLE II

| Annealing Temperature (° C.) | Jsc (mA/cm$^2$) | Voc (V) | FF (%) | PCE (%) | Rs (Ω cm$^2$) | Rsh (Ω cm$^2$) |
|---|---|---|---|---|---|---|
| 170 | 15.8 | 0.801 | 61.1 | 7.72 | 5.39 | 624 |
| 200 | 16.2 | 0.804 | 63.6 | 8.29 | 5.35 | 759 |
| 220 | 16.6 | 0.803 | 63.4 | 8.45 | 5.30 | 754 |

At 170° C., the average PCE of devices was 7.72%. By increasing the ETL annealing temperature to 200° C. and 220° C., the PCE increased to 8.29% and 8.45%, respectively. A major contributor to the increase in PV performance was the increase in the Jsc and FF. At lower annealing temperatures, the ZTO composite likely has poor crystallinity, which improves with higher annealing temperatures. However, by annealing the electron transport layer at 220° C., device efficiencies up to 8.99% were attained. The sol-gel synthesis for ZTO thin films is able to obtain high performance at significantly lower annealing temperatures compared to the standard ZnO films. Annealing the electron transport layer at lower temperatures is beneficial when transferring processing to flexible plastic substrates and roll-to-roll processing.

Optical Properties of Zinc Tin Oxide Films

Figure 3:
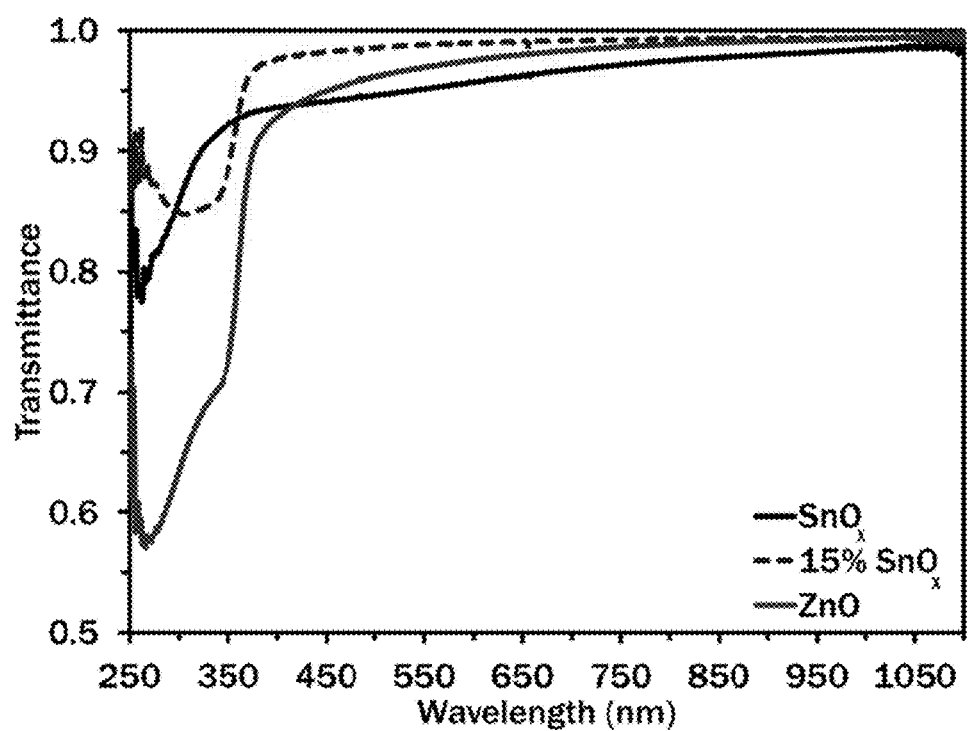
FIG. 3 depicts the transmittance of SnOx, 15% SnOx and ZnO films on glass substrates.

As light must first pass through the electron transport layer to the photoactive layer to generate charges, high transparency of the film across the solar spectrum is critical. The transparency of SnOx, ZnO, and 15% SnOx was characterized on glass substrates and the transmittance spectra are presented in FIG. 3. It is common for the scientific community to benchmark the transmittance of transparent conductors at 550 nm. From FIG. 3, the transparency of the 15% SnOx sample is superior to the single component metal oxides, reaching 98.8% transparency at 550 nm. ZnO and SnOx films are 96.9% and 95.2% transparency at 550 nm. The superior optical properties of 15% SnOx are reflected in this composite obtaining the highest average Jsc in OPV devices. Allowing more photons to pass through the cathode and electron transport layer can increase the absorption of the photoactive layer, resulting in higher Jsc.

Figure 4:
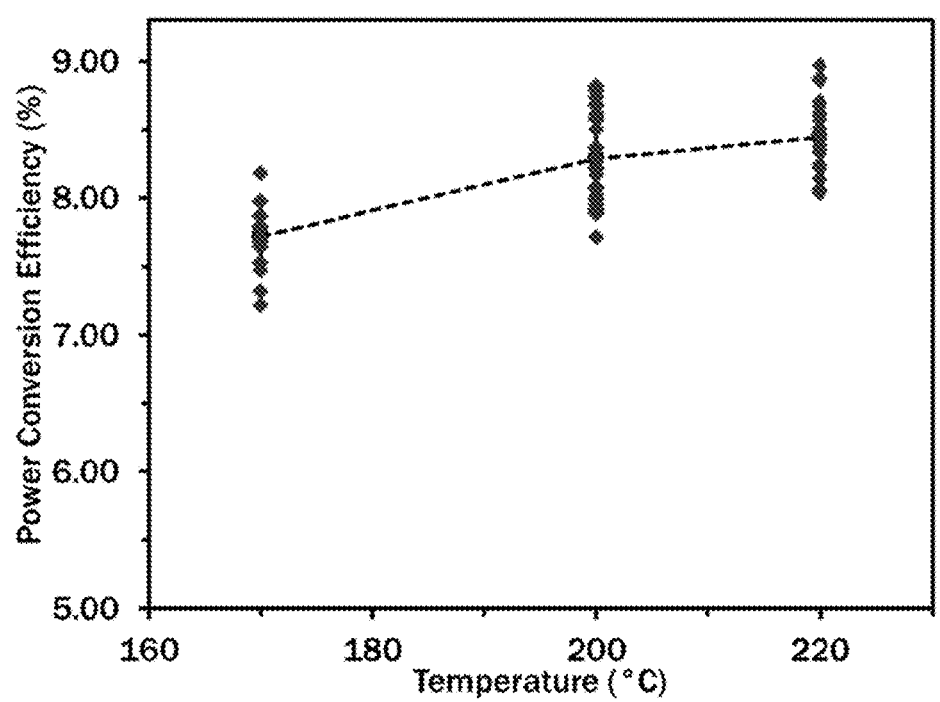
FIG. 4 depicts the effect of annealing temperature on the power conversion efficiency of OPV devices with the following architecture: ITO/(SnOx)0.15:(ZnO)0.85/P(BDTE-FTTE)/MoOx/Ag.

The ZnO film shows an excitonic peak at ~346 nm, which is characteristic of small ZnO crystallites. When adding 15% SnOx to ZnO, the peak shifts to higher energy at ~325 nm. This blue-shift is characteristic with a reduction in the crystallite size of ZnO by the addition of SnOx. The peak width is significantly wider, indicating a higher degree of polydispersity of ZnO crystallite sizes in these films. The SnOx spectrum is nearly featureless with a very small electronic transition at ~475 nm. As this peak intensity is very small, the SnOx film has a low degree of crystallization. As shown in FIG. 4, higher annealing temperatures may increase the crystallinity of SnOx and mixed ZTO films, however higher temperatures must be balanced by processing cost and adaptability to flexible plastic substrates.

Work Function of Mixed Metal Oxide Films

To understand the role of SnOx in the mixed metal oxide films we determined the work function of the films using ultraviolet photoelectron spectroscopy (UPS). UPS is analogous to X-ray photoelectron spectroscopy (XPS) but uses ultraviolet radiation instead. Since the power of UV light is lower than X-rays, UPS is even more surface sensitive compared to XPS. As such, UPS typically characterizes the top 1-3 nm surface of films. In photoelectron spectroscopy, the addition of UV energy (hv) and kinetic energy (KE) of emitted electrons is equivalent to the binding energy (BE) of electrons within a specific atomic orbital. This is formalized into the following equation:

$$BE = KE + hv \quad (1)$$

UPS detects both photoelectrons and secondary electrons. The cutoff of the secondary electron peak at high binding energy is concomitant with the film's surface work function, which is the minimum amount of energy required to remove an electron from a film to vacuum. The work function of anodes, cathodes and carrier transport layers is critical in organic photovoltaics as it determines the device's polarity, as well as carrier extraction efficiency.

Figure 5:
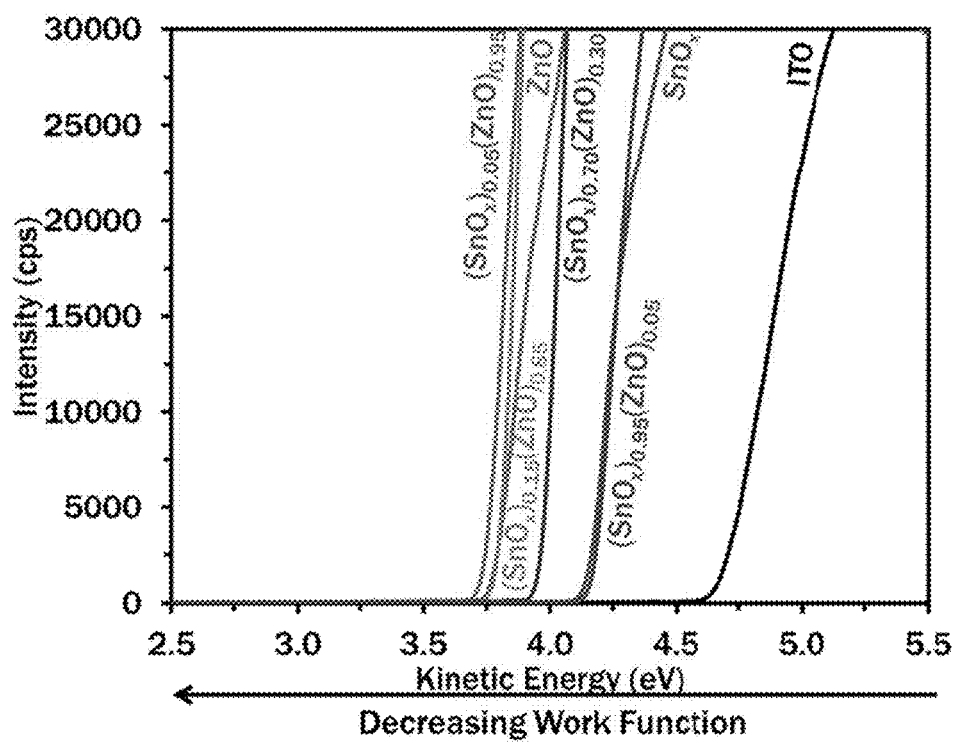
FIG. 5 depicts the UPS spectra of ITO, SnOx, ZnO and the mixed metal oxide ZTOs.

The UPS spectra of mixed metal oxide films are seen in FIG. 5. The spectra are plotted showing the secondary electron cutoff region where the work function is determined. The work function of the ITO cathode is 4.65 eV. In order for ITO to collect electrons, the work function must be lowered to increase electron specificity. Both ZnO and SnOx decrease the work function to 3.75 eV and 4.15 eV, respectively. For composite films at 95% and 70% SnOx, the work function is in between the single component metal oxide and is 4.13 eV and 3.93 eV. Further decreasing the SnOx content reduces the work function lower than ZnO-only films to reach 3.73 eV at 30% SnOx and 3.68 eV at 5% SnOx. These two compositions also have the lowest Rs as seen in Table I, which indicates a reduction of resistive losses in the OPV devices. Further reducing the work function beyond that of ZnO is particularly interesting as the mixed metal combination obtains different physical properties compared to the individual materials on their own.

Figure 6:
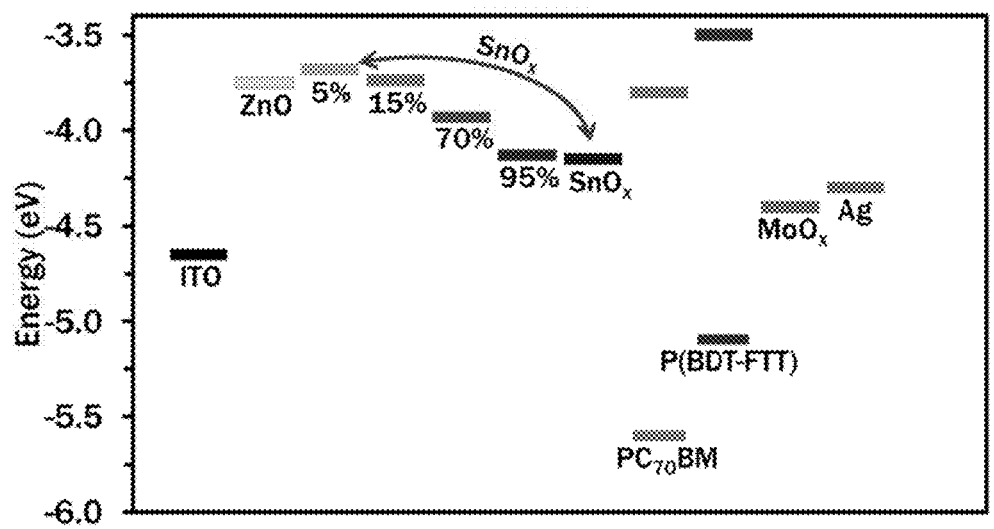
FIG. 6 depicts the energy diagram illustrating the tunable work function of SnOx:ZnO mixed metal oxide composites in alignment with the other layers in the OPV device stack

An energy band diagram for the organic photovoltaic device architecture is presented in FIG. 6. The figure reiterates that decreasing SnOx content in ZTO films reduces the work function. Ideally the work function of the electron transport layer should be less than the lowest unoccupied molecular orbital energy of PCBM. This is the case for 15% and 5% SnOx as well as 100% ZnO. For the ZTO composites, lowering the tin content to 15% improves photovoltaic performance as a result of improved interfacial energy alignment. ZTO composites less than 15% tin have a reduction in performance. This may be the result of lowering the film conductivity with increasing zinc content.

ZTO films contain 15-20 atomic % of acetate as characterized with X-ray photoelectron spectroscopy. Table III below depicts the atomic concentration of ZTO films cast from 65% and 35% diluted sol-gel solutions.

TABLE III

| | 65% | | | | 35% | |
|---|---|---|---|---|---|---|
| | Room Temperature | 170° C. | 210° C. | 240° C. | 170° C. | 210° C. |
| O | 43.6 | 43.6 | 44.3 | 45.3 | 43.4 | 44.3 |
| C—C | 17.6 | 14.9 | 12.7 | 10.4 | 20.4 | 25.2 |
| COOH | 11.3 | 10.3 | 8.5 | 6.3 | 4.8 | 3.4 |
| Zn | 26.0 | 28.9 | 31.4 | 35.0 | 27.7 | 22.4 |
| Sn | 0.7 | 1.4 | 2.1 | 2.2 | 3.8 | 4.8 |
| N | 0.8 | 0.9 | 1.1 | 0.8 | — | — |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A reaction comprising:
mixing an organic Zn precursor in the amounts of (1−y) with,
an organic Sn precursor in the amounts of y, and
a base in the amount of (1−y) to 1, wherein 0>y>1
followed by annealing at a temperature from about 170° C. to about 220° C. to produce $(SnO_x)_yZnO_{(1-y)}$, wherein 0>y>1, and wherein $(SnO_x)_yZnO_{(1-y)}$ contains from about 10 to 25% atomic % of acetate as characterized with x-ray photoelectron spectroscopy.

2. The reaction of claim 1, wherein the organic Zn precursor comprises $Zn(CH_3CO_2)_2 \ast 2H_2O$.

3. The reaction of claim 1, wherein the organic Sn precursor comprises $Sn(CH_3CO_2)_2$.

4. The reaction of claim 1, wherein the base is an alcohol.

5. The reaction of claim 1, wherein the base is alkanolamine.

6. The reaction of claim 1, wherein the reaction also comprises a solvent.

7. The reaction of claim 1, wherein the solvent is 2-methoxyethanol.

8. The reaction of claim 1, wherein the reaction occurs at a temperature above room temperature.

9. The reaction of claim 1, wherein the reaction occurs at a temperature greater than 150° C.

10. The reaction of claim 1, wherein the reaction occurs at a temperature less than 250° C.

11. The reaction of claim 1, wherein the reaction occurs at a temperature less than 225° C.

12. The reaction of claim 1, wherein $(SnO_x)_yZnO_{(1-y)}$ is used as an electron transport layer for an organic photovoltaic device.

13. A reaction comprising:
mixing an organic Zn precursor comprising $Zn(CH_3CO)_2$ in the amounts of (1−y) with
an organic Sn precursor comprising $Sn(CH_3CO_2)_2$ in the amounts of y, and
a base comprising alkanolamine in the amount of (1−y) wherein 0>y>1,
wherein the reaction occurs at a temperature less than 225° C. followed by annealing at a temperature from about 170° C. to about 220° C. to produce $(SnO_x)_yZnO_{(1-y)}$, wherein 0>y>1, and wherein $(SnO_x)_yZnO_{(1-y)}$ contains from about 10 to 25% atomic % of acetate as characterized with x-ray photoelectron spectroscopy.

* * * * *